United States Patent [19]
Kohno et al.

[11] Patent Number: 4,845,548
[45] Date of Patent: Jul. 4, 1989

[54] SOLID-STATE COLOR IMAGING APPARATUS HAVING COLOR FILTERS WITH CORRECTED TRANSMISSION CHARACTERISTICS

[75] Inventors: Akiyoshi Kohno; Nobukazu Teranishi, both of Tokyo, Japan

[73] Assignee: NEC Corporation, Tokyo, Japan

[21] Appl. No.: 147,604

[22] Filed: Jan. 22, 1988

Related U.S. Application Data

[63] Continuation of Ser. No. 23,964, Mar. 10, 1987, abandoned, which is a continuation of Ser. No. 739,916, May 31, 1985, abandoned.

[30] Foreign Application Priority Data

May 31, 1984 [JP] Japan ................................ 59-111326
May 31, 1984 [JP] Japan ................................ 59-111327

[51] Int. Cl.$^4$ ............................................ H04N 9/083
[52] U.S. Cl. ........................................ 358/47; 358/44
[58] Field of Search ..................... 358/41, 43, 44, 47

[56] References Cited

U.S. PATENT DOCUMENTS

| | | | |
|---|---|---|---|
| 4,450,475 | 5/1984 | Ishikawa et al. | 358/44 |
| 4,477,832 | 10/1984 | Takemura | 358/44 |
| 4,500,913 | 2/1985 | Hashimoto et al. | 358/44 |

FOREIGN PATENT DOCUMENTS

| | | | |
|---|---|---|---|
| 57-39684 | 3/1982 | Japan | |
| 57-109489 | 7/1982 | Japan | 358/44 |
| 57191 | 3/1986 | Japan | |
| 161090 | 7/1986 | Japan | |

Primary Examiner—James J. Groody
Assistant Examiner—Robert M. Bauer
Attorney, Agent, or Firm—Burns, Doane, Swecker & Mathis

[57] ABSTRACT

A solid-state color imaging apparatus having a plurality of picture elements for converting incident light to signal charges with the picture elements being arrayed regularly in both a horizontal direction and a vertical direction to form horizontal rows and vertical columns. First color filters are on the picture elements in odd numbered rows for providing modulation characteristics of color components and causing the picture elements in the odd numbered rows to generate a first color difference signal. Second color filters are on the picture elements in even numbered rows for providing modulation characteristics of color components and causing the picture elements in the even numbered rows to generate a second color difference signal. The first and second color difference signals are substantially zero when achromatic light is incident upon the picture elements or is picked up at a reference color temperature.

5 Claims, 11 Drawing Sheets

EVEN-FIELD ODD-FIELD $l_1 + l_2$ $l_3 + l_4$ $l_2 + l_3$ $l_4 + l_5$

SOLID-STATE COLOR IMAGING APPARATUS HAVING COLOR FILTERS WITH CORRECTED TRANSMISSION CHARACTERISTICS

This application is a continuation, of application Ser. No. 023,964, filed Mar. 10, 1987, which is a continuation of application Ser. No. 739,916 filed May 31, 1985, both now abandoned.

BACKGROUND OF THE INVENTION

This invention relates to a solid-state color imaging apparatus.

An interline transfer CCD imaging element (hereinafter, abbreviated to "IL-CCD imaging element") comprises a plurality of picture elements arrayed regularly in both a horizontal direction and a vertical direction to form horizontal rows and vertical columns. Vertical CCD registers transfer, in the vertical direction, signal charges which are photoelectrically converted by and stored in the picture elements. At the ends of the vertical column, a horizontal CCD register transfers them in the horizontal direction to an output portion.

The IL-CCD imaging element is capable of two sorts of read-out operations which are a frame storage operation in which the signal charges stored in the picture elements are read out during every frame period, and a field storage operation in which they are read out during every field period. The time of the field storage operation is half that of the frame storage time and results in less afterimage. For this reason, the development of a single-plate color imaging device for effecting the field storage operation is being promoted.

In color imaging by the use of the IL-CCD imaging element, the color separated images of a subject are formed by color filters. The color separated images are picked up by the IL-CCD imaging element. The output signals of the IL-CCD imaging element are processed, thereby to obtain chrominance and luminance signals.

A conventional IL-CCD imaging apparatus having a conventional color filter has a disadvantage, to be described below. The signal of each horizontal line is a sum of the signal charges obtained by independently and spatially sampling the two adjacent picture elements in the vertical direction and is not constituted by a single horizontal line signal. This causes a very large vertical color error in the output signal of the conventional imaging apparatus when the apparatus picks up a subject having a vertical repetition frequency wherein white and black picture elements alternately exist in the vertical direction. That is, a sharp vertical contour portion having no vertical correlation between two adjacent horizontal picture element rows inevitably generates a vertical color error under achromatic light.

OBJECTS AND BRIEF SUMMARY OF THE INVENTION

It is, therefore, an object of this invention to provide a solid-state color imaging apparatus capable of producing faithful output signals even when a sharp vertical contour portion having no vertical correlation is picked up under an achromatic color light.

According to this invention, there is provided a solid-state color imaging apparatus having an improved color filter. The color filter has the characteristic that a color difference signal in each horizontal line obtained by adding signal charges of two adjacent picture elements in the vertical direction becomes zero when an achromatic color subject is picked up at a reference lighting color temperature, and a color signal modulation component for each horizontal picture element row becomes zero under the achromatic color light.

BRIEF DESCRIPTION OF THE DRAWINGS

The features and advantages of this invention will be understood from the following detailed description of preferred embodiments, taken in conjunction with the accompanying drawings, wherein.

DETAILED DESCRIPTION OF THE INVENTION

First, a conventional CCD color imaging apparatus will be described with reference to FIGS. 1 through 6.

A conventional IL-CCD imaging element (FIG. 1) comprises picture elements 1 arrayed regularly in a horizontal direction and a vertical direction. Vertical CCD registers 2 transfer, in the vertical direction, signal charges which are photoelectrically converted by and stored in the picture elements 1. At the ends of the vertical columns, a horizontal CCD register 3 transfers them in the horizontal direction, to an output portion 4.

Figure 1:
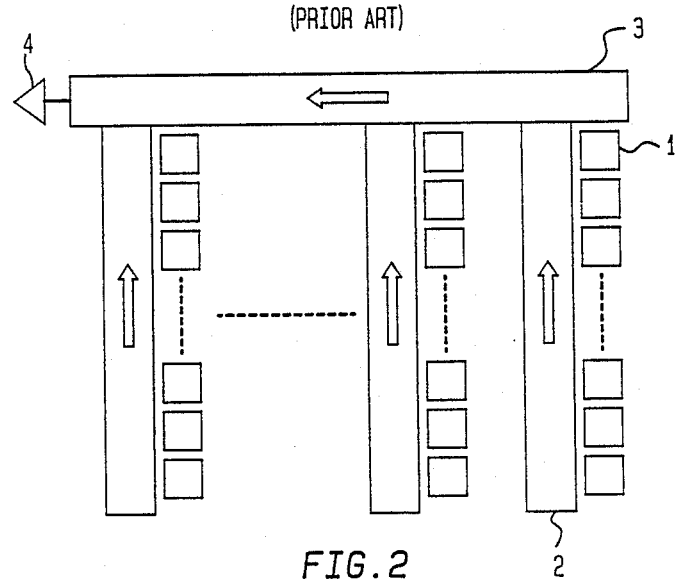
FIG. 1 is a schematic view of a conventional interline transfer CCD imaging element.

Arrows are used in FIG. 1 to indicate the transfer directions of the signal charges.

Figure 2:
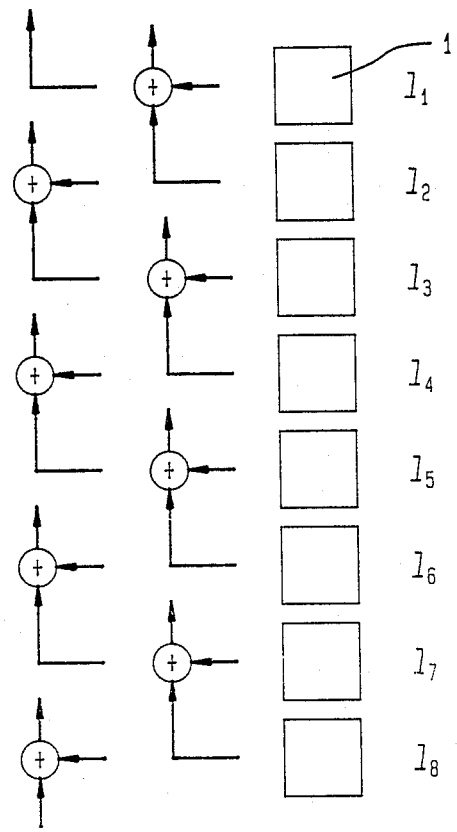
FIG. 2 is a diagram schematically showing the read-out of signal charges in the conventional interline transfer CCD imaging element in a field storage mode.

FIG. 2 schematically illustrates the field storage operation. Rows in the horizontal direction are successively marked $l_1, l_2, l_3, l_4, —l_8,$ —beginning with a certain row. In odd-numbered fields, the signal charges are first transferred to the vertical CCD registers 2 from the picture elements corresponding to lines or rows $l_2, l_4, l_6, l_8, —$. The signal charges corresponding to one picture element are substantially shifted by the shift operation of each vertical CCD register 2. Further, the signal charges are transferred to the vertical CCD registers 2 from the picture elements corresponding to lines or rows $l_1, l_3, l_5, l_7, —$. As a result, the signal charges of the picture corresponding to lines or rows $l_2, l_4, l_6, l_8, —$are respectively added with the signal charges of the picture elements corresponding to lines or rows $l_1, l_3, l_5, l_7,$ —in the vertical CCD register 2. The signal charges of each of the lines or rows $l_1+l_2, l_3+l_4, l_5+l_6, l_7+l_8,$ —are added and used as a signal for one horizontal period.

In even-numbered fields, the combinations of the rows of the picture elements in the horizontal direction which are to be added in the vertical CCD registers 2 are changed into lines or rows $l_2+l_3, l_4+l_5, l_6+l_7, —$. The combinations of the two respectively adjacent rows in the vertical direction are changed every field, in this manner, thereby performing an interlined operation.

In color imaging by the use of the IL-CCD imaging element, as stated above, the color separated images of a subject are formed by color filters. The output signals of the IL-CCD imaging element are processed, to obtain chrominance signals and luminance signals.

Figure 3:
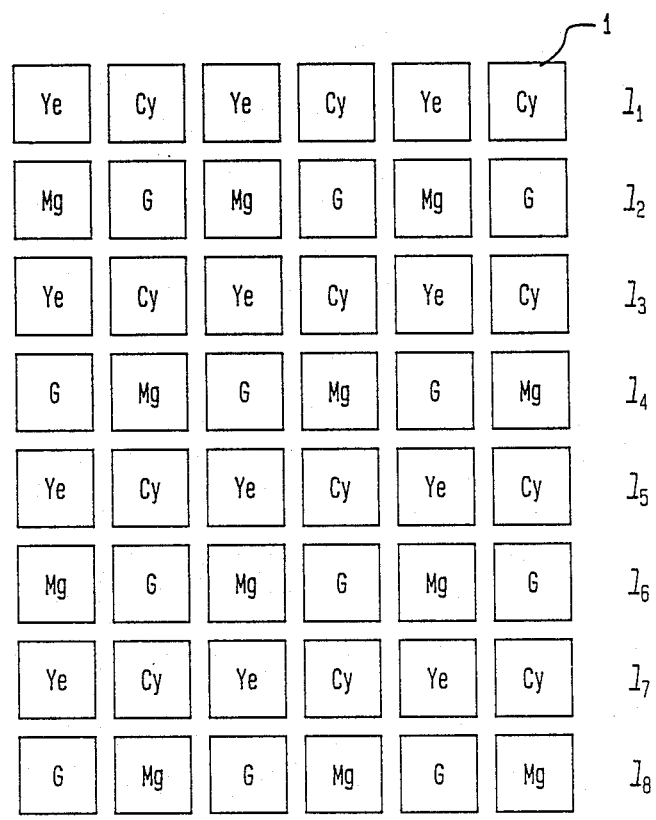
FIG. 3 is a schematic partial plan view showing the arrangement of color filters and the mutual relationships between the color filters and picture elements in a conventional color imaging apparatus.

FIG. 3 is a schematic partial plan view showing the color arrangement of the color filters as used in a conventional single-plate color imaging apparatus of the field storage operation also showing the mutual relationships between the color filters and the picture elements.

Referring to FIG. 3, the plurality of picture elements 1 are regularly arranged in the horizontal direction and in the vertical direction. The color filters are formed on the respective picture elements 1. The letters Ye, Cy, Mg and G indicate the color filters for yellow, cyan, magenta and green, respectively. The yellow color filter transmits red and green light, the cyan color filter transmits blue and green light, and the magenta color filter transmits red and blue light. The color filters are arrayed with two picture elements forming one cycle in the horizontal direction and with four picture elements forming one cycle in the vertical direction. The rows in the horizontal direction are identified as lines or rows $l_1, l_2, l_3—, l_8,$ —successively from a certain row. From the left toward the right in the horizontal direction, filters Ye and Cy are alternately and repeatedly arranged in the horizontal rows $l_1$ and $l_5$; filters Mg and G are alternately arranged in the next rows $l_2$ and $l_6$; filters Ye and Cy in the next rows $l_3$ and $l_7$; and filters G and Mg in the next rows $l_4$ and $l_8$.

Figure 4:
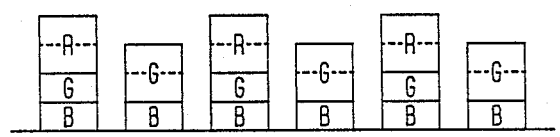
FIG. 4 is a diagram schematically showing the outputs of respective color signals from the conventional interline transfer CCD imaging element which is furnished with the color filters in FIG. 3.
Figure 4:
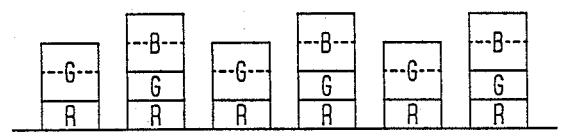
Figure 4:
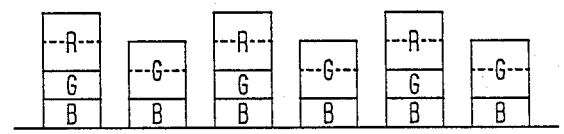
Figure 4:
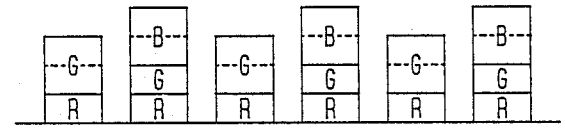

FIG. 4 is a diagram schematically showing the magnitude of the outputs of the color signals from the respective picture elements, formed with the aforementioned color filters, in the case of the field storage operation. These color signals result from an array of filters, as shown in FIG. 3. The letters B, G and R respectively denote a blue signal, a green signal and a red signal, the ratio of which are set at 1:1:1. As illustrated in FIG. 4, when the output signals are averaged, $R+3/2G+B$ is obtained. This combination of signals is used as the luminance signal. Color difference signals are alternately (every one horizontal line) superposed as modulation components $(R-\frac{1}{2}G)\cos wt$ and $(B-\frac{1}{2}G)\cos wt$ with two picture elements forming one cycle in the horizontal direction. Here, w denotes an angular frequency which corresponds to the cycle of two picture elements. The output signals $S(l_1+l_2)$ and $S(l_3+l_4)$ of lines or rows $l_1+l_2$ and $l_3+l_4$ are indicated by the following equation.

$$S(l1 + l2) = (B + 2G + R - B\cos wt + R\cos wt)/2 +$$
$$(B + G + R + B\cos wt + R\cos wt - G\cos wt)/2$$
$$= B + 3/2G + R + (R - 1/2G)\cos wt$$

$$S(l3 + l4) = (B + 2G + R - B\cos wt + R\cos wt)/2 +$$
$$(B + G + R - B\cos wt - R\cos wt + G\cos wt)/2$$
$$= B + 3/2G + R - (B - 1/2G)\cos wt$$

Figure 5:
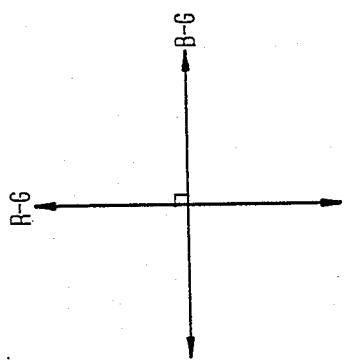
FIG. 5 is a diagram showing a conventional color difference vector.

The NTSC color television signal can be constituted by using $(B+3/2G+R)$ as the luminance signal, and the modulation components $(R-\frac{1}{2}G)$ and $(B-\frac{1}{2}G)$ as two orthogonal color difference signals as shown in FIG. 5. The signals of the even-numbered fields are similarly constituted, because the signal $S(l_2+l_3)$ and $S(l_4+l_5)$ are same as the signals $S(l_1+l_2)$ and $S(l_3+l_4)$, respectively.

Figure 6:
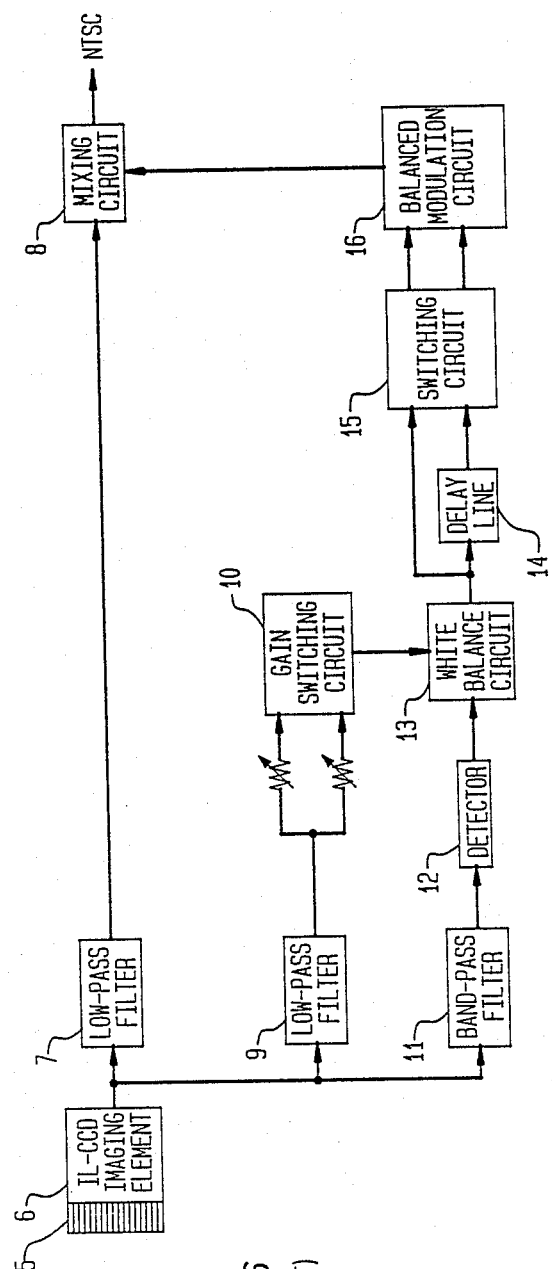
FIG. 6 is a schematic block diagram of a conventional single-plate type color imaging device.

FIG. 6 is a schematic block diagram of the single-plate type of color imaging device. The output signal of the IL-CCD imaging element 6 is derived from the color filters, which are arrayed as stated above. The output signal is passed through a low-pass filter 7 in order to remove the modulation components and to become the luminance signal Y, which is applied to a mixing circuit 8. Besides, the output signal of the IL-CCD imaging element 6 becomes a narrow band luminance signal when sent through a low-pass filter 9, having a pass band which is lower than that of the low-pass filter 7. The narrow band luminance signal is applied to a gain switching circuit 10. Further, the output signal of the IL-CCD imaging element 6 can separate the modulation components by passing them through a band-pass filter 11 having a center frequency which is a frequency corresponding to the recurrence cycle of two picture elements in the horizontal direction. The output signal of the band-pass filter 11 is detected by a detector 12 to provide color difference signals $(R-\frac{1}{2}G)$ and $(B-\frac{1}{2}G)$, which are supplied to a white balance circuit 13 which is supplied with the narrow band luminance signal from the gain switching circuit 10. The sequential color difference signal is converted simultaneously by 1H delay line 14 and 1H switch circuit 15, and applied to a balanced modulation circuit 16 to perform a quadrature two phase modulation. The output signal from the balanced modulation circuit 16 is mixed with the luminance signal to provide the NTSC color television signal.

The IL-CCD imaging apparatus, having the color filters as shown in FIG. 3, has a disadvantage to be described below. In case of a subject having a vertical repetition frequency wherein white and black picture elements alternately exist every one picture element, the imaging apparatus produces an output signal with a very large vertical color error. This is because the signal of each horizontal line is a sum of the signal charges obtained by independently and spatially sampling the two adjacent picture elements in the vertical direction, and is not constituted by a signal horizontal line signal. For example, assuming that the line $l_1$ is white, and the line $l_2$ is black, the signal $S(l_1+l_2)$ is represented by the following equation.

$$S(l_1+l_2) = \tfrac{1}{2}B + G + \tfrac{1}{2}R + \tfrac{1}{2}(R-B)\cos wt$$

As can be seen from this equation, the color difference signal component is $\tfrac{1}{2}(R-B)$, which is different from the original component $(R-\tfrac{1}{2}G)$, and a vertical color error is thereby generated. In other words, vertical color error is inevitably generated at a sharp vertical contour portion which has no vertical correlation between two adjacent horizontal picture element rows. Such a vertical color error appears regardless of whether the subject has chromatic color or achromatic color. The change in hue of a horizontal line on the chromatic picture presents no problem visually. However, color imported to the achromatic picture which should not be colored, presents a problem visually to a degree which is not tolerable.

Further, with the color filters shown in FIG. 3, the filter Cy does not transmit the red component, the filter Ye does not transmit the blue component, and the filter G does not transmit the red and blue components. Therefore, luminance components of the subject of color lights that are not transmitted from the picture elements having such color filters cannot be obtained. Namely, the number of sampling points decreases for the red and blue light components, and the level of luminance signal changes greatly for each of the picture elements at the time of zooming or panning in the imaging operation, and a false signal called false luminance signal is inevitably generated.

Figure 7:
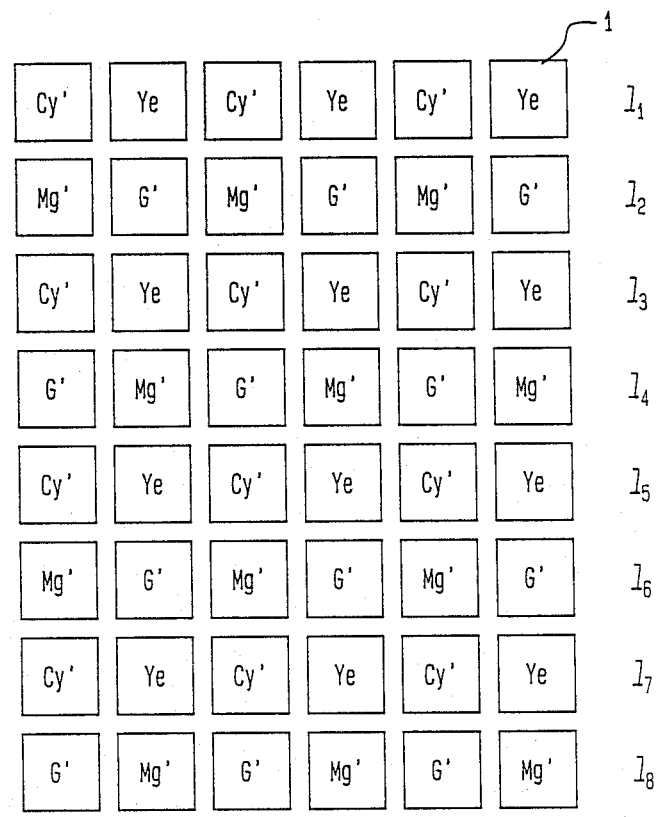
FIG. 7 is a schematic partial plan view showing the arrangement of color filters and the mutual relationship between the color filters and picture elements in accordance with a first embodiment of this invention.
Figure 8A:
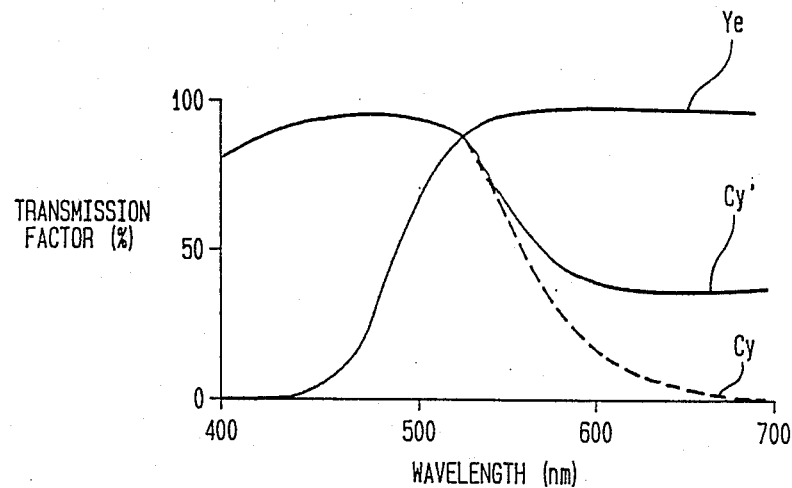
FIGS. 8(a) and 8(b) are diagrams each showing the color separation characteristics of the color filters of FIG. 7.
Figure 9A:
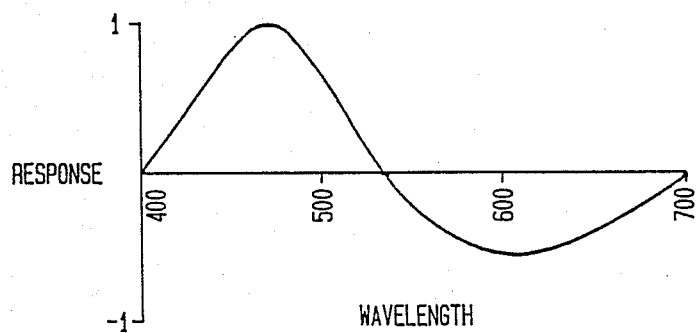
FIGS. 9(a) and 9(b) are diagrams each showing the spectral characteristics of the color filters of FIG. 7.

FIG. 7 is a schematic partial plan view showing the arrangement of color filters and the mutual relationships between the color filters and the picture elements in accordance with a first embodiment of this invention. The first and third horizontal rows $l_1$ and $l_3$, and $l_5$ and $l_7$ of picture elements have color filters Cy' and Ye having transmission characteristics shown in FIG. 8(a) after every other picture element. The color filter Ye transmits green and red light components but does not transmit the blue light component. The color filter Cy' transmits the green and blue components. Furthermore, the color filter Cy' transmits the red light component, which is not allowed to pass through with the conventional Cy color filter, with a transmission degree of about 50%, as shown in FIG. 8(a). In the first and third horizontal picture element rows on which the color filtes Ye and Cy' are arranged, the green light component and a part of the red light components are transmitted. Therefore, a first color difference signal Cl in the row $l_1, l_3, l_5, l_7$ is $(B-R)$, as shown in FIG. 9(a). Spectral characaristics of the color filters Ye and Cy' are determined taking into consideration the spectral characteristics of the optical system consisting of the image lens, infrared ray cut filter, imaging element, and the like, so that the color difference signal C1 will become zero when white, which is achromatic color illuminated at a reference color temperature pf 3200° K., is picked up by the color solid-state imaging device of the present invention.

At the color temperature of 3200° K., the amount of the R component is about twice that of the B component even if the spectral characteristics of the imaging element, infrared ray cut filter and the like are taken into consideration. Therefore, use is made of the color filter Ye which does not substantially permit the passage of the B component like the conventional filter so that the B component is modulated as effectively as possible in the signal C1. Moreover, use is made of the color filter Cy' which has spectral characteristics allowing the passage of about 50% of the R light components, that is substantially blocked with the conventional color filter Cy, in order to permit the passage of the B component as efficiently as possible, and to produce such modulation characteristics that the R components in the signal C1 will become equal to the B component when white color is picked up at 3200° K.

FIG. 9 shows response characteristics relative to the wavelength of the color difference signal C1 when white color is picked up being illuminated at 3200 K. The integrated value is zero indicating that the first color difference signal C1 is zero with the achromatic light of 3200° K. In the first horizontal picture element rows $l_1$ and $l_5$ and in the third horizontal picture element $l_3$ and $l_7$. the color filters are arranged in the same manner as shown in FIG. 7, and the first color difference signal C1 has the same phase.

Figure 8B:
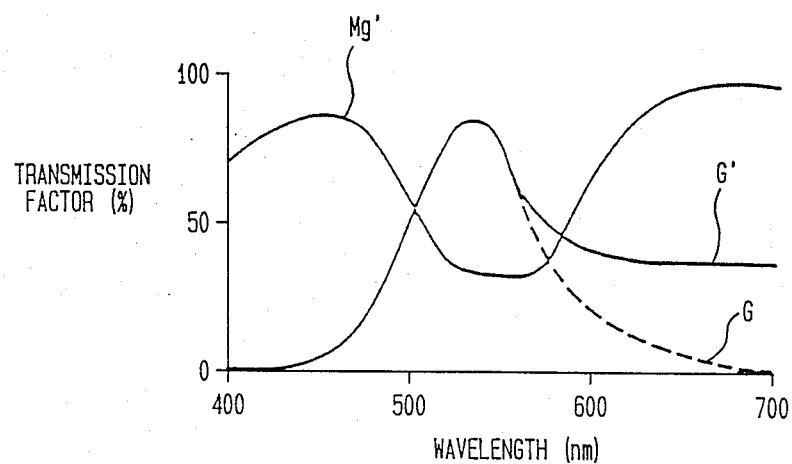
Figure 9B:
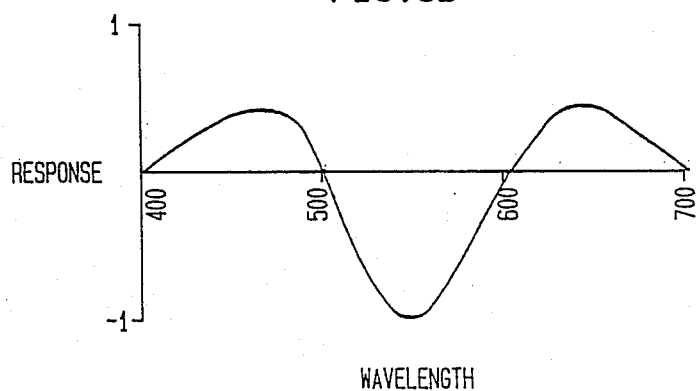

In the second and fourth horizontal picture element rows 2 and $l_4$, and $l_6$ and $l_8$, on the other hand, color filters Mg' and G' having transmission characteristics shown in FIG. 8(b) are formed after every other picture element. The color filter G' is formed by lamination of filters Cy' and Ye that are used in the first and third horizontal picture element rows, and has spectral characteristics to permit the passage of about 50% of R component. The second color difference signal C2 in the second horizontal picture element rows $l_2$ and $l_6$ on which the color filter G' and Mg' are arranged is represented by $C2 = R+B-G$, as shown in FIG. 9(b). The spectral characteristics of the color filters Mg' and G' are determined by taking into consideration the spectral characteristics of the optical system consisting of image lens, infrared ray cut filter, imaging element and the like, so that the color difference signal C2 will become zero when white illuminated at 3200 K is picked up.

According to this embodiment, the color filter G' permits the passage of the R component. Therefore, the modulation degree for the R component in the signal C2 is lowered to a signal quantity nearly equal to the B component. Hence, the transmission factor of-the color filter Mg' for the G component is so determined that the sum of the R and B components becomes equal to the signal quantity of G component, and that white balance is maintained. For this purpose, the filter Mg' transmits the G component at a transmission factor greater than that of the conventional filter Mg. In the second and fourth horizontal picture element rows on which the color filters Mg' and G' are arranged, part of the green light component which forms the green signal component and part of the red light component which forms the red signal component are permitted to pass through.

FIG. 9(b) shows response characteristics relative to the wavelength of the color difference signal C2 when white is picked up being illuminated at 3200° K. The integrated value is zero indicating that with the achromatic light of 3200° K., the second color difference signal C2 is zero. In the second horizontal picture element rows $l_2$ and $l_6$ and in the fourth horizontal picture element rows $l_4$ and $l_8$, arrangements of the color filters Mg' and G' are different from each other by 180°, and the color difference signals C2 have phases that are different from each other by 180°.

When the field storage operation is carried out using the color imaging element having the color filter arrangement mentioned above, the output signals of the two adjacent horizontal picture element rows are added to each other in the odd-numbered fields to produce the signals $S(l_1+l_2)$, $S(l_3+l_4)$, —. The third color difference signal C3 in the signal $S(l_1,+l_2)$ is obtained by adding the first and second color difference signals C1 and C2. The fourth color difference signal C4 in the signal $S(l_3+l_4)$ is obtained by adding the first color difference signal C1 for the row $l_3$ and the second color difference signal C2 for the row $l_4$ having a phase different by 180° from the second color difference signal C2 for the row $l_2$. Namely, the following color difference signals are obtained, $$C3=C1+C2=(B-R)+(R+B-G)$$

$$C4=C1-C2=(B-R)-(R+B-G)$$

Since the first and second color difference signals C1 and C2 to be added are zero under the condition of achromatic light, the third and fourth color difference signals C3 and C4 are zero under the achromatic light. To simplify the explanation, letters R, G and B represent only color components of the signals.

Thus, when the color difference signal of each horizontal line is zero under the achromatic light and the color difference signal of each horizontal picture element row is zero, no error appears in the color difference signals of the horizontal lines for the achromatic subject in which there is no correlation between the two adjacent horizontal picture element rows in the vertical direction, and white balance need not be corrected. Therefore, no error appears in correcting the white balance, and vertical color error is prevented from occurring on the achromatic picture that presents most serious visual interference.

Figure 10:
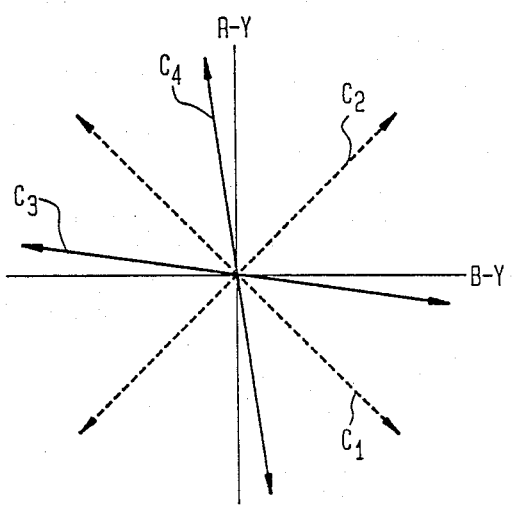
FIG. 10 is a diagram showing a color difference vector.

FIG. 10 is a vector diagram schematically illustrating the color difference signals C1, C2, C3 and C4. The color difference signal C3 is roughly equivalent to the color difference signal B-Y, and the color difference signal C4 is roughly equivalent to the color difference signal R-Y.

The luminance signal is obtained as an average value of four picture elements of color filters Cy', Ye, Mg' and G', and is the same for all the horizontal lines. The green light component is obtained in all of the four picture elements. The red component which contributes greatly to the luminance component is also contained in all of the four picture elements like the green component. The blue component which contributes less to the luminance component is contained in two picture elements.

According to the present invention as described above, sampling points of the green light components exist on all of the picture elements and sampling points of the red components which contributes greatly to the luminance component also exist on all of the picture elements. Therefore, even when the subject moves slowly when the zooming or panning is effected, and particularly when a subject containing large amounts of red light component moves, the level of luminance signal changes little for each of the picture elements, and generation of false luminance signal can be reduced. The invention is particularly effective in suppressing false luminance signals that are generated when the subject is move in the vertical direction and that cannot be averaged by the electrically working low-pass filters.

This effect is not sufficient when the transmission factors are smaller than 20% for the red, green and blue lights of picture elements. Formation of the false luminance signal is reduced when the transmission factors are greater than 20%, and is conspicuously reduced when the transmission factors are greater than 35%.

Similarly, in case of even-numbered fields, the third color difference signal C3 can be obtained for the rows $l_2$ and $l_3$ and the fourth color difference signal C4 can be obtained for the rows $l_4$ and $l_5$, making it possible to prevent the occurrence of vertical color error and false luminance signal.

The above description was made with the reference to the ideal case where the color difference signals C1 and C2 become zero under the achromatic light. In practice, however, the color difference signals do not necessarily become zero at all times due to variance in the spectral characteristics of the color filters and imaging element. In this case, errors appear in the color difference signals and in the white balance correction. From the evaluation of the amplitude and the vertical color error of the carrier chrominance signal by using residual color difference signals when a uniform and achromatic subject of 100% luminance level is picked up being illuminated at a reference color temperature, however, it has been clarified that the vertical color error is almost not discernible if the error is smaller than 15% of a maximum amplitude of carrier chrominance signal that is given by the cyan or red signal of 100% color bar as measured, for example, by the NTSC standard system; and it has also been clarified that the vertical color error is virtually permissible if it is smaller than 25% thereof. Namely, the effects of the invention are obtained if residual components of the color difference signals C1, C2, C3 and C4 lie within this range under the achromatic light.

The white balance of color difference signal for each horizontal picture element row can be evaluated most correctly based on the frame storage operation in which the signal of a horizontal picture element row is used as the signal of a horizontal line. However, the white balance can also be evaluated by the subject in which one of two horizontal picture element rows added in the field storage operation becomes black, or by the mask on the imaging element.

The solid-state imaging element of the color solid-state imaging apparatus according to the first embodiment of this invention produces an NTSC color television signal quite in the same manner as the singe-plate color imaging apparatus shown in FIG. 6.

As will be obvious from the above description, this invention is effective only for the achromatic color of a reference color temperature of the color camera. That is, for the white color at color temperature, the color difference signals are not white-balanced, giving rise to the occurrence of vertical color error. Even in the conventional systems, however, the vertical color error increases or decreases depending upon the color temperature. According to this invention, however, generation of the vertical color error is sufficiently reduced at least at the color temperature near the reference color temperature. By combining the color temperature-changing filters, therefore, generation of the vertical color error can be prevented for the illumination of almost all color temperature.

Figure 11:
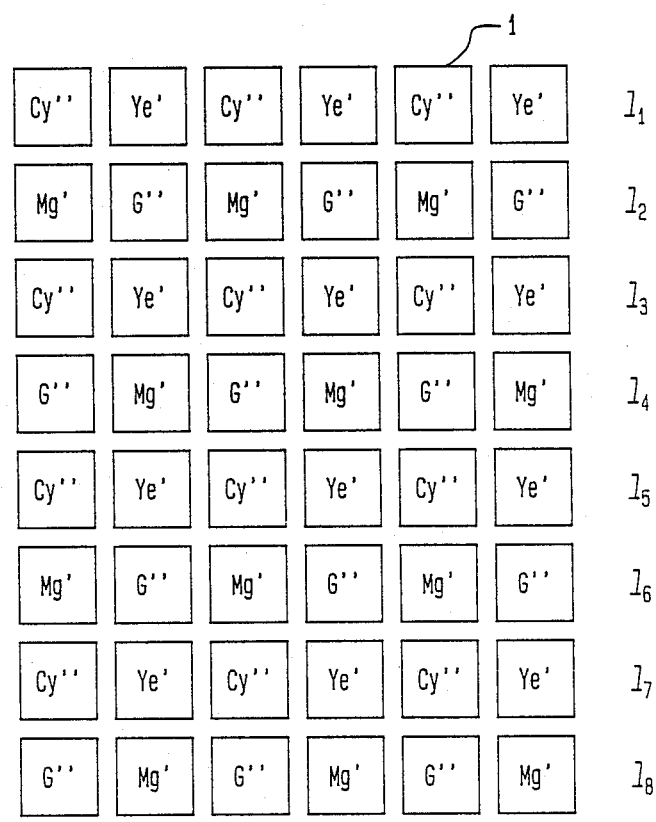
FIG. 11 is a schematic partial plan view showing the arrangement of color filters and the mutual relationships between the color filters and the picture elements in accordance with a second embodiment of this invention.
Figure 12A:
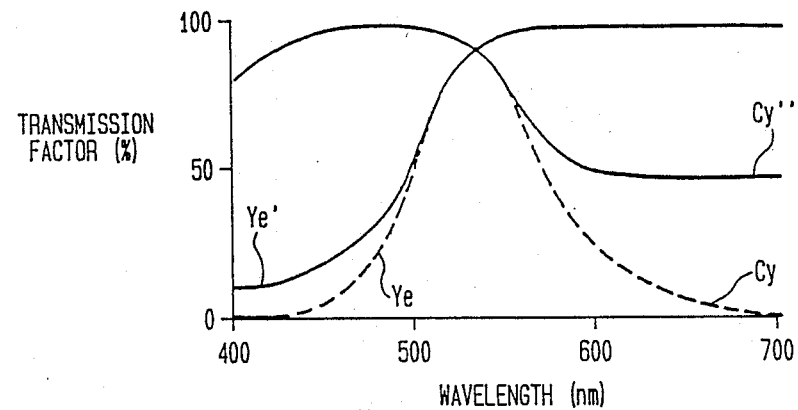
FIGS. 12(a) and 12(b) are diagrams each showing the color separation characteristics of the color filters of FIG. 11.

A second embodiment shown in FIG. 11 is identical to the first embodiment except for the following points:

(1) The filters Ye for the odd-numbered rows are substituted by filters Ye'. As shown in FIG. 12(a), the filters Ye' transmit the green and the red light components and 35% of the blue light component.

(2) The filters Cy' for the odd-numbered rows are substituted by filters Cy'. The color separation characteristic of the filters Cy'' is so determined by taking the imaging element, infrared cut filter and the like into consideration that when white illuminated at the reference color temperature of 3200° K. is picked up, the first color difference signal C1=(B−R) becomes zero. In other words, the filters Cy'' transmit not only the blue and the green light components but also 65% of the red light component, as shown in FIG. 12(a).

Figure 12B:
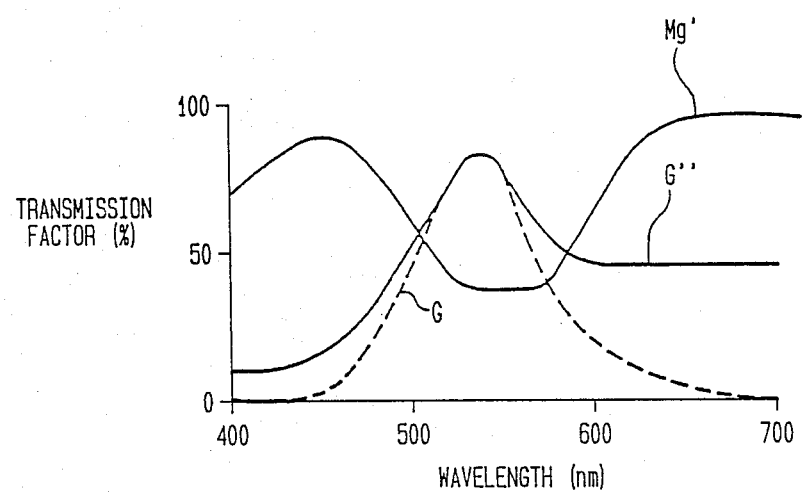

(3) The filters G' for the even-numbered rows are substituted by filters G''. As shown in FIG. 12(b), the filters G'' transmit not only the green light component but also 35% of the blue light component and 65% of the red light component.

(4) The transmission factor of the green light component in the filter Mg' is so determined that in the second color difference signal C2=(R+B−G), the G component will become equal to the sum of R and B components when white is picked up at the reference color temperature of 3200° K., whereby the second color difference signal C2 becomes zero.

As in the first embodiment, the filters Mg' and G' are arranged to be different by 180° so that the second color difference signals will have phases that are different by 180° between the second horizontal picture element rows and the fourth horizontal picture element rows. When white illuminated at 3200° K. is picked up, the response characteristics for the wavelengths of color difference signals C1 and C2 obtained from the horizontal picture element rows becomes that shown in FIGS. 9(a) and 9(b) of the first embodiment, and the integrated values thereof become zero.

When the field storage operation is effected using the color imaging element having the aforementioned color filter arrangement, the third and fourth color difference signals become zero under the condition of achromatic light as in the first embodiment, making it possible to prevent the occurrence of vertical color error for the achromatic subject which has no correlation between the two horizontal picture element rows that are adjacent in the vertical direction. These color difference signals C1, C2, C3 and C4 have nearly the same phases as those of the signals shown in the vector diagram of FIG. 10 in connection with the first embodiment.

According to this embodiment, formation of the false luminance signal is greatly reduced when compared with the first embodiment. Namely, as shown in FIGS. 12 (a) and 12(b), three light components that form red, green and blue signals are all allowed to pass through the color filters by more than 35% in the first and third horizontal picture element rows. Even in the second and fourth horizontal picture element rows, the three light components R, G and B are allowed to pass through every color filter, making it possible to greatly reduce the generation of false luminance signals for the subject rich in red and blue colors. According to this embodiment as described above, improvement is accomplished markedly, not only with regard to the vertical color error, but also with regard to reducing false luminance signals.

Figure 13:
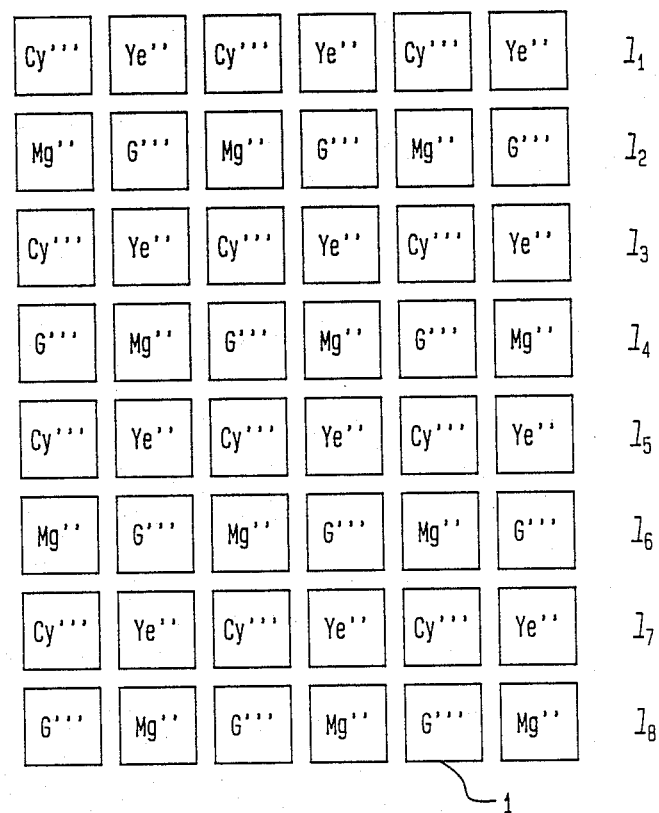
FIG. 13 is a schematic partial plan view showing the arrangement of color filters and the mutual relationships between the color filters and picture elements in accordance with a third embodiment of this invention.
Figure 14A:
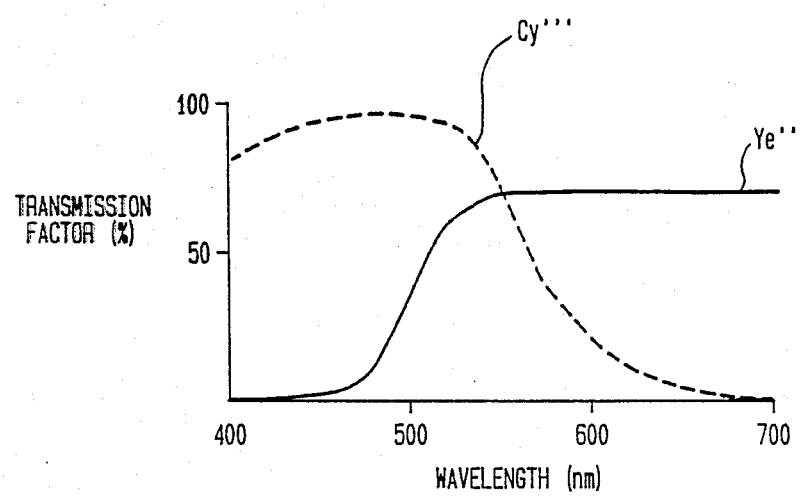
FIGS. 14(a) and 14(b) are diagrams each showing the color separation characteristics of the color filters of FIG. 13.

A third embodiment shown in FIG. 13 is identical to the first embodiment except for the following points:

(1) The filter Ye for the odd-numbered rows are substituted by filters Ye'' having a characteristic as shown in FIG. 14(a).

(2) The filter Cy' for the odd-numbered rows are substituted by filters Cy'''. The color separation characteristic of the filters Cy''' is so determined by taking the imaging element, infrared cut filter and the like into consideration that when white illuminated at the reference color temperature of 3200° K. is picked up, the first color difference signal C1 =(B−R) becomes zero. The color separation characteristic of the filter Cy''' is shown in FIG. 14(a).

Figure 14B:
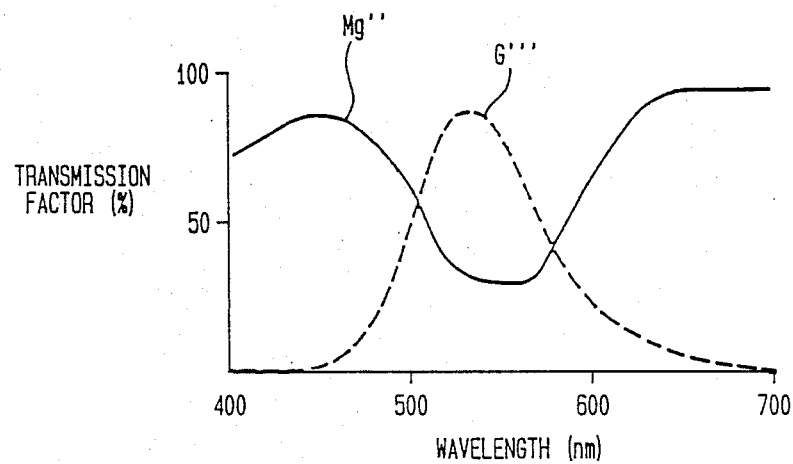

(3) The filter G' for the even-numbered rows are substituted by filters G''' as shown in FIG. 14(b).

(4) The transmission factor of the green light component in the filter Mg'' is so determined that in the second color difference signal C2=(R+B−G), the G component will be become equal to the sum of R and B components when white is picked up at the reference color temperature of 3200° K., whereby the second color difference signal C2 becomes zero.

As in the first embodiment, the color filters Mg'' and G''' are arranged to be different by 180° so that the second color difference signals will have phases the are different by 180° between the second horizontal picture element rows and the fourth horizontal picture element rows.

According to this invention as described in detail above, there is realized a color solid-state imaging apparatus in which color difference signals obtained from the horizontal lines become almost zero for the achromatic light at a reference color temperature and, hence, white balance correction becomes zero or very small. Furthermore, color signal modulation components of horizontal picture element rows constituting the color difference signals of the horizontal lines are complete color difference signals which become zero under the condition of achromatic light. Hence, there appears every little error in the color difference signals or in the white balance correction for the subject which has no correlation between the two horizontal picture element rows, making it possible to eliminate the vertical color error on a sharp vertical contour on the chromatic picture, which is not visually permissible. Moreover, when a subject rich in red and blue components is picked up in a zooming manner or panning manner, the signal level does not greatly change for each of the picture elements, and the formation of false luminance signals can be reduced.

What is claimed is:

1. A solid-state color imaging apparatus having a plurality of picture elements, for converting incident light to signal charges, arrayed regularly in both a horizontal direction and a vertical direction to form horizontal rows and vertical columns, first color filter means on said picture elements in odd numbered rows for providing modulation characteristics of color components and causing said picture elements in said odd numbered rows to generate a first color difference signal and second color filter means on said picture elements in even numbered rows for providing modulation characteristics of color components and causing said picture elements in the even numbered rows to generate a second color difference signal, said first color filter means including cyan-color filter elements and yellow-color filter elements, alternatively, and said second color filter means including green-color filter elements and magenta-color filter elements, alternatively, wherein said cyan-color filter elements and said green-color filter elements have a transmission characteristic to additionally transmit a red-color component such that said first and second color difference signals are substantially zero when acrhomatic light is incident upon the picture elements at a reference color temperature.

2. A solid-state imaging apparatus as set forth in claim 1, wherein said second color filter means on said picture elements in said even numbered rows generates a phase-reversed second color difference signal.

3. In a solid-state imaging apparatus having a plurality of picture elements arranged regularly in both a horizontal direction and in a vertical direction to form horizontal rows and vertical columns and wherein color filtres are positioned on each picture element, said color filters being arranged in a recurrence cycle in sets of four in the vertical direction, said color filters on said picture elements in the first and third rows being of a construction to cause the generation of a first color difference signal component modulated with a predetermined number of picture elements forming one cycle in the horizontal direction, said color filters on said picture elements in the second row being of a construction to cause the generation of a second color difference signal component modulated with a predetermined number of picture elements forming one cycle in the horizontal direction, said color filters on said picture elements in the fourth row being of the same construction as the color filters on said picture elements in the second row, displaced by one column for generating a phase-reversed second color difference signal, said color filters having transmission characteristics such that said first and second color difference signals are substantially zero when an achromatic color subject is picked up at a reference color temperature.

4. In a solid-state imaging apparatus as claimed in claim 3, said color filters in the first and third rows including cyan-color filter elements and yellow-color filter elements, alternatively, and said color filters in the second and fourth rows including green-color filter elements and magenta-color filter elements, alternatively, wherein said cyan-color filter elements have an additional transmission characteristic capable of transmitting a red-color component and said green-color filter elements have an additional transmission characteristic capable of transmitting a red-color component.

5. In a solid-state imaging apparatus as claimed in claim 3, said color filters in the first and third rows including cyan-color filter elements and yellow-color filter elements, alternatively, and said color filters in the second and fourth rows including green-color filter elements and magenta-color filter elements, alternatively, wherein said cyan-color filter elements have an additional transmission characteristic capable of transmitting a red-color component, said yellow-color filter elements have an additional transmission characteristic capable of transmitting a blue-color component and said green-color filter elements have an additional transmission characteristic capable of transmitting a blue-color component and a red-color component.

* * * * *